United States Patent
Yamazaki et al.

(10) Patent No.: US 8,359,704 B2
(45) Date of Patent: Jan. 29, 2013

(54) ENGINE BLOWER

(75) Inventors: Maki Yamazaki, Kawagoe (JP); Lars Malmqvist, Huskvarna (SE)

(73) Assignee: Husqvarna Zenoah Co., Ltd., Kawagoe-Shi (JP)

( * ) Notice: Subject to any disclaimer, the term of this patent is extended or adjusted under 35 U.S.C. 154(b) by 364 days.

(21) Appl. No.: 12/864,954

(22) PCT Filed: Jan. 8, 2009

(86) PCT No.: PCT/JP2009/050497
§ 371 (c)(1),
(2), (4) Date: Jul. 28, 2010

(87) PCT Pub. No.: WO2009/096236
PCT Pub. Date: Aug. 6, 2009

(65) Prior Publication Data
US 2011/0000048 A1    Jan. 6, 2011

(30) Foreign Application Priority Data
Feb. 1, 2008  (JP) ................................ 2008-022895

(51) Int. Cl.
*A47L 5/06*    (2006.01)
(52) U.S. Cl. .............. 15/327.5; 15/344; 15/405; 15/410
(58) Field of Classification Search ................. 15/327.5, 15/344, 405, 410
See application file for complete search history.

(56) References Cited

U.S. PATENT DOCUMENTS

| 6,552,891 | B1 | 4/2003 | Prach |
| 7,279,021 | B2 | 10/2007 | Haberlein |
| 7,406,742 | B2 * | 8/2008 | Joos et al. ........................ 15/405 |
| 2005/0039298 | A1 | 2/2005 | Joos |
| 2006/0185114 | A1 | 8/2006 | Joos et al. |

FOREIGN PATENT DOCUMENTS

| JP | 53-25912 | 7/1978 |
| JP | 58-54207 Y2 | 12/1983 |
| JP | 4-37641 Y2 | 9/1992 |
| JP | 8-279398 A | 10/1996 |

(Continued)

OTHER PUBLICATIONS

International Search Report dated Mar. 3, 2009 issued in International Appln. No. PCT/JP2009/050497.

(Continued)

*Primary Examiner* — William Gilbert
*Assistant Examiner* — Patrick Maestri
(74) *Attorney, Agent, or Firm* — Holtz, Holtz, Goodman & Chick, PC

(57) ABSTRACT

An engine blower includes: an engine integrated with a volute for driving a fan; a ventilation tube communicated with the volute; and a handle mounted to the ventilation tube. In the engine blower, the handle has a pair of cases that are assembled with each other, and a conductive resin layer is formed on a surface of a grip of the handle. The resin layer is integrated with gates exposed within the handle. A conductive spring having a coil compressed in a direction in which the cases are assembled with each other and a cable that is electrically coupled with the engine are disposed within the handle. The gate of the resin layer is brought into contact with the coil of the spring and is electrically coupled with the cable via the spring.

4 Claims, 5 Drawing Sheets

FOREIGN PATENT DOCUMENTS

| | | | |
|---|---|---|---|
| JP | 2001-073793 | A | 3/2001 |
| JP | 2004-319297 | A | 11/2004 |
| JP | 3690787 | B2 | 6/2005 |
| JP | 4025543 | B2 | 10/2007 |
| JP | 2008-019734 | A | 1/2008 |
| JP | 2008-106660 | A | 5/2008 |

OTHER PUBLICATIONS

International Preliminary Report on Patentability dated Aug. 3, 2010 (in English) issued in counterpart International Application No. PCT/JP2009/050497.

* cited by examiner

ENGINE BLOWER

This application is a U.S. National Phase Application under 35 USC 371 of International Application PCT/JP2009/050497 filed Jan. 8, 2009.

TECHNICAL FIELD

The present invention relates to an engine blower.

BACKGROUND ART

In a conventional engine blower, air is ejected due to the rotation of a fan driven by an engine for cleaning or the like. Because air is ejected through a ventilation tube in such engine blower, static electricity is generated due to friction between an inner wall of the ventilation tube and the ejected-air and is built up in the ventilation tube, especially when air is dry. Consequently, when an operator touches the ventilation tube in which the static electricity is built up, the built-up static electricity is suddenly flowed through the operator's body, which is annoying to the operator. In order to prevent such problem, various static-elimination structures have been suggested (for example, Document 1: JP-A-2001-73793, Document 2: JP-A-2004-319297).

Document 1 discloses that a grounding wire is provided to be gripped with a handle by an operator, and an end of the grounding wire is disposed within the handle to be in contact with a Bowden wire used for operating an accelerator. In such structure as disclosed in Document 1, static electricity generated in a ventilation tube during operation is conducted from the operator into the grounding wire, and then into an engine via the Bowden wire. Thus, while the operator grips the handle and the grounding wire for working, the static electricity is grounded to the engine without being built up in the ventilation tube so that the static electricity is not suddenly flowed through the operator's body. Document 1 also discloses that the grounding wire may be in contact with a grounding line used for an ignition switch in place of the Bowden wire.

Similarly, Document 2 discloses that a circular discharge plate is provided to be gripped with a handle by an operator, and the discharge plate is electrically coupled with a Bowden wire provided within the handle via a flexible conductive plate. Such structure disclosed in Document 2 can attain the same advantages as the structure disclosed in Document 1.

Also, in some other conventional engine blowers, a conductive resin layer is provided on a surface of a handle in place of the grounding wire or the discharge plate as disclosed in Document 1 or 2, and the resin layer is electrically coupled with a Bowden wire provided within the handle via a conductive member. In such static-elimination structure, because it is not required to provide the grounding wire or the discharge plate, the number of parts and the parts cost can be reduced. Further, assembly of the parts can be simplified.

However, when the conductive resin layer is provided on the handle, it may be difficult to maintain electrical coupling between the resin layer and the Bowden wire. In other words, the conductive member provided within the handle and the resin layer are not highly reliably connected with each other due to variations in parts dimension or in assembly accuracy. Thus, it has been desired to solve such problem.

DISCLOSURE OF INVENTION

An object of the invention is to provide an engine blower capable of ensuring a stable electric conductivity when a conductive resin layer is provided on a handle.

An engine blower according to an aspect of the invention includes: a fan accommodated in a volute; an engine integrated with the volute for driving the fan; a ventilation tube communicated with the volute; and a handle mounted to the ventilation tube, in which the handle has at least a pair of cases that are assembled with each other, a conductive resin layer is formed on a surface of a grip of the handle, the resin layer is integrated with interior exposed sections exposed within the handle, a conductive spring having a coil compressed in a direction in which the cases are assembled with each other and a conductive line that is electrically coupled with the engine are disposed within the handle, and the interior exposed sections of the resin layer are brought into contact with the coil of the spring while being electrically coupled with the conductive line via the spring.

According to the aspect of the invention, the interior exposed sections of the conductive layer are in contact with the coil of the spring, so that the interior exposed sections are electrically coupled with the engine via the spring and the conductive line. Thus, static electricity built up in the ventilation tube and the like can be conducted from the engine to the grip of the handle, and then discharged through the operator gripping the handle. Since the coil can be compressed in the direction in which the cases are assembled with each other at this time, the coil can be brought into contact with the interior exposed sections by a predetermined tensional force generated in the coil. Further, even when projecting amounts of the interior exposed sections vary in the assembling direction or when the interior exposed sections are misaligned in the assembling direction, such variation or misalignment can be adjusted by the coil that is elastically deformed. Thus, the coil and the interior exposed sections can be highly reliably brought into contact with each other.

In the engine blower according to the aspect of the invention, a projection and a recess that are fitted into each other for positioning may be provided on the pair of cases, the spring may be disposed with the coil penetrated by the projection, and the interior exposed sections may be provided adjacent to the recess and the projection, respectively When the projection for positioning penetrates the coil of the spring and the interior exposed sections are respectively adjacent to the projection and the recess as described above, a positional misalignment of the coil and the interior exposed sections can be prevented. Thus, the coil and the interior exposed sections can be further reliably brought into contact with each other.

In the engine blower according to the engine blower, a spring may be provided with an engagement engaged on a side adjacent to the conductive line.

When the spring is provided with the engagement as described above, the engagement is engaged with the conductive line. Thus, the spring can be prevented from being rotated about the projection, so that the coil can be favorably brought into contact with the conductive line of the spring.

In the engine blower according to the aspect of the invention, the interior exposed sections are provided by gates that are formed when the resin layer is formed by resin molding.

When the interior exposed sections are provided by the gates formed by resin molding as described above, it is not required to dedicatedly provide the interior exposed sections for contact with the coil, thereby simplifying the structure thereof. Thus, the resin can be smoothly injected and molding failures can be prevented.

BEST MODE FOR CARRYING OUT THE INVENTION

An exemplary embodiment of the invention will be described below with reference to the accompanying drawings.

Figure 1:
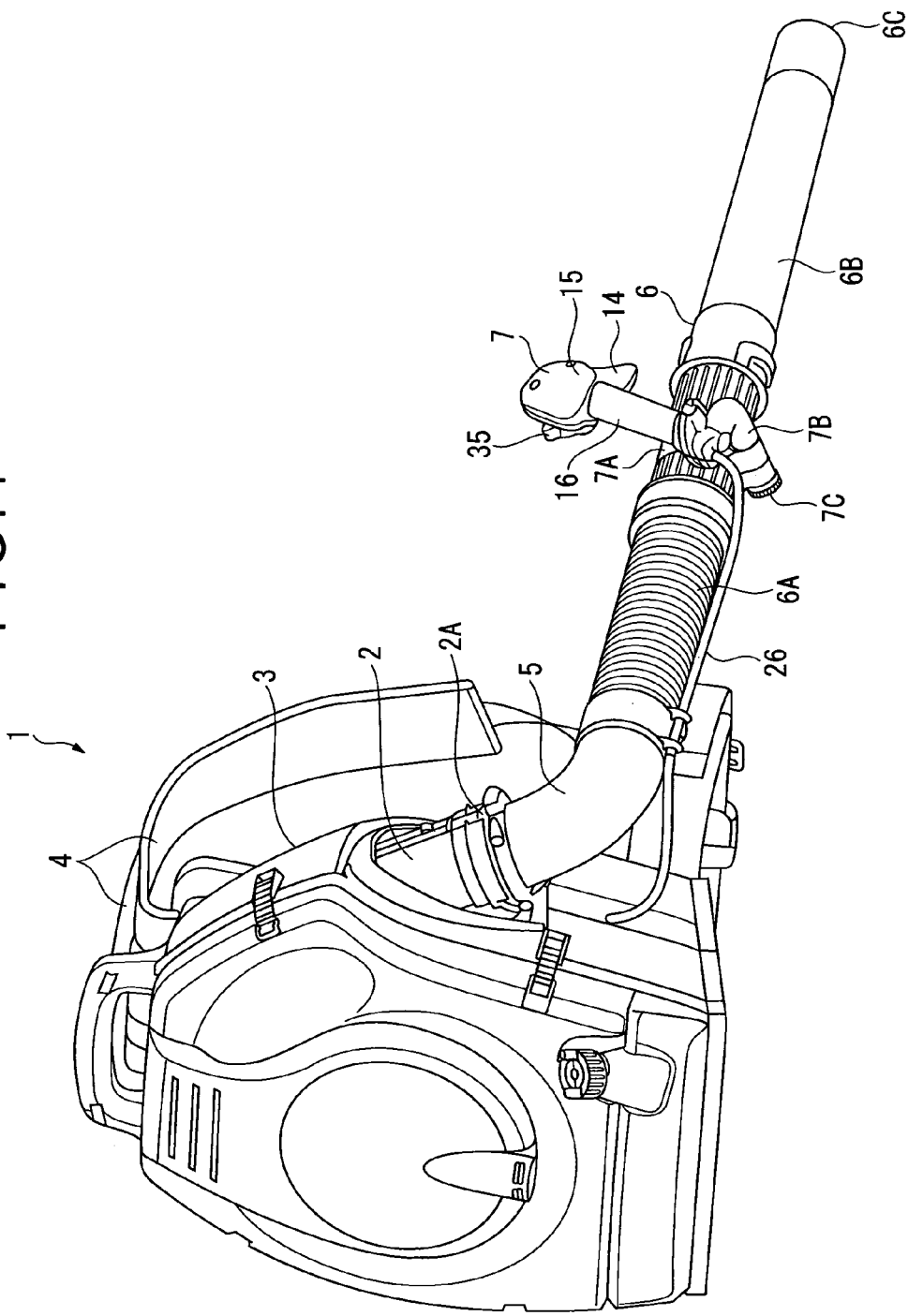
FIG. 1 is a perspective view entirely showing an engine blower according to an exemplary embodiment of the invention.

FIG. 1 is a perspective view entirely showing an engine blower 1 according to the exemplary embodiment. The engine blower 1 includes an engine (not shown) cranked by a recoil starter, and a fan driven by the engine.

The engine is fixed integrally to a resin volute 2 covering the rotating fan by a bolt or the like. A portion of the volute 2 opposed to the engine provides a back support 3. The back support 3 is provided with a pair of shoulder straps 4 so that an operator carries the entire engine blower 1 on his back.

A tubular elbow 5 is connected with an outlet 2A of the volute 2, and a ventilation tube 6 having a bellows section 6A and a straight tube section 6B is connected with the elbow 5. An end of the ventilation tube 6 provides a blow-out port 6C. Ejected-air generated by the fan passes through the volute 2, the elbow 5, and the ventilation tube 6 to be ejected from the blow-out port 6C. A handle 7 gripped by an operator is attached to the ventilation tube 6 by a loop holder 7A, an arm 7B, and a bolt-shaped wheel 7C that makes the holder 7A and the arm 7B to be tightened together.

In the engine blower 1 as described above, the elbow 5 and the ventilation tube 6 are made of resin. Especially when air is dry, static electricity is generated in the volute 2, the elbow 5 and the ventilation tube 6 due to friction with the ejected-air that passes therethrough, and is positively or negatively charged depending materials thereof. A structure for eliminating such static electricity will be described below in detail.

Figure 2:
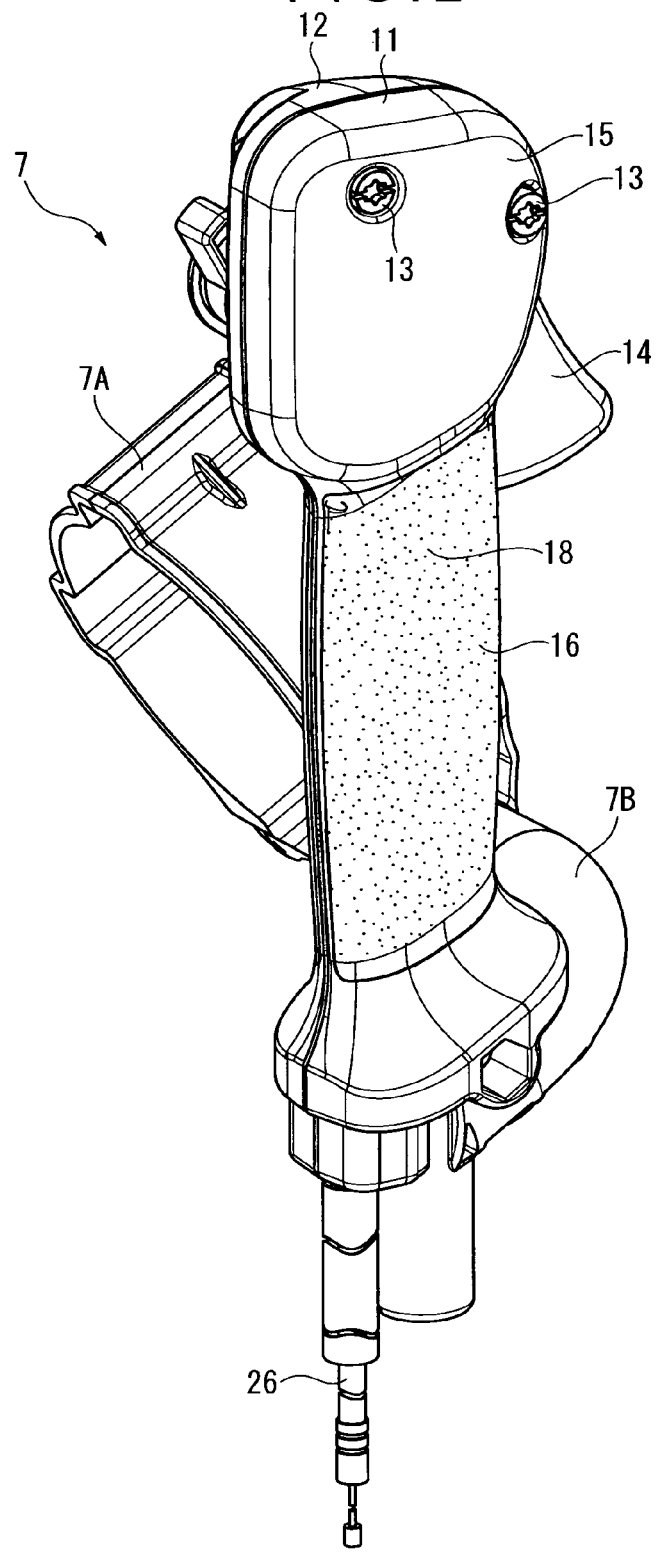
FIG. 2 is a perspective view showing an external appearance of a handle of the engine blower.

FIG. 2 is a perspective view showing an external appearance of the handle 7 having the static-elimination structure according to the exemplary embodiment. The handle 7 has a halved-structure in which a pair of cases 11 and 12 are integrated with each other by a screw 13 shown in the upper portion of the figure and a bolt (not shown) provided in the lower portion. An upper portion of the handle 7 defines an operating section 15 including an accelerator lever 14, and a middle portion of the handle 7 defines a grip 16 gripped by an operator. A part of the arm 7B projects from a lower portion of the handle 7 while the rest part of the arm 7B is inserted into the handle 7. The loop holder 7A is attached to the arm 7B by the wheel 7C (FIG. 1).

Figure 3:
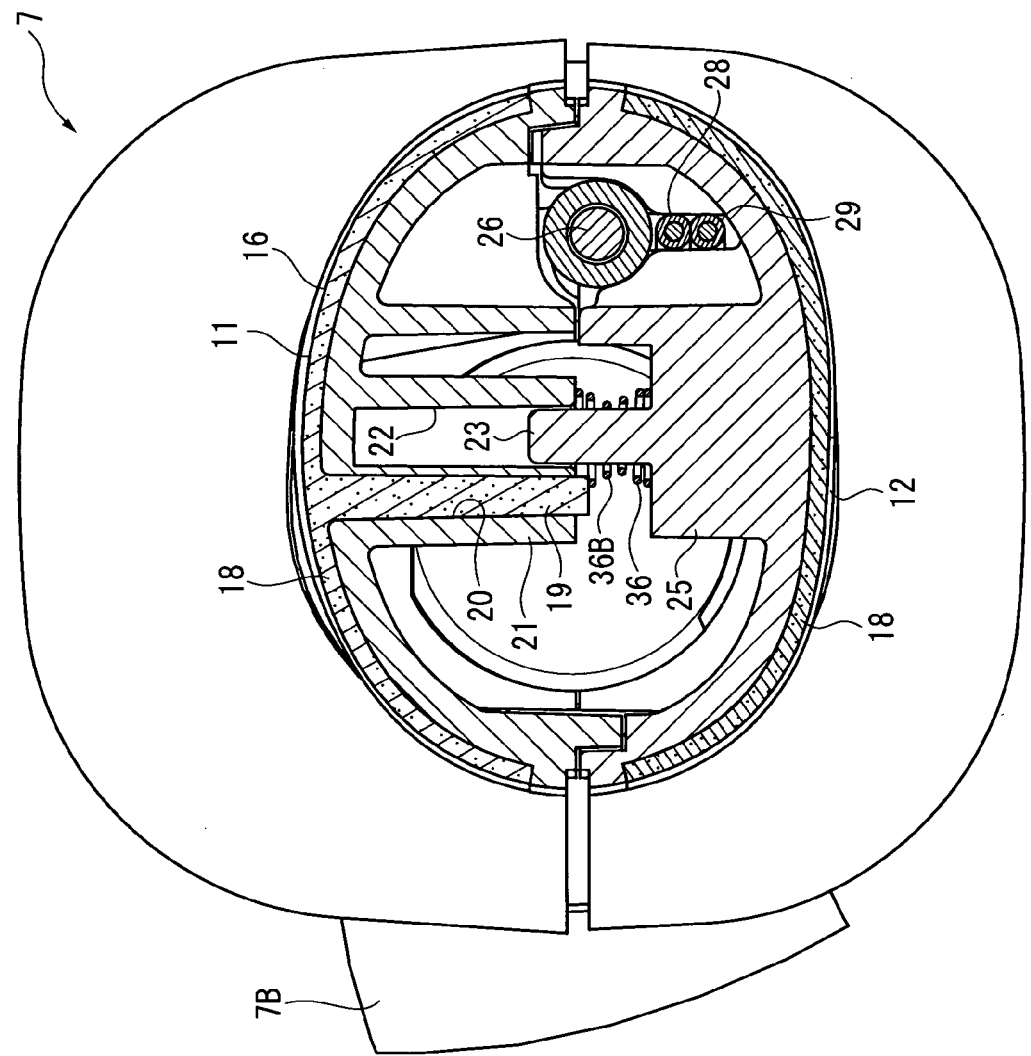
FIG. 3 is a cross sectional view showing a primary part of the handle, taken along A-A line in FIG. 4.

The cases 11 and 12 are mainly made of insulative synthetic resin. As shown in FIG. 3 in cross section, a surface of a portion corresponding to the grip 16 is provided by a conductive resin layer 18. The resin layer 18 is formed to be united with the grip 16 of a resin-molded case body by injection-molding of a conductive resin material or the like. Referring to the case 11 in FIG. 3, the conductive resin material is injected to form a gate 19 at an inner side of the case 11. The gate 19 defines an interior exposed section according to the invention. Also, though not illustrated, a plurality of small through holes are formed on the grip 16. The through holes are filled up with the conductive resin material to enhance adhesion between the case body and the resin layer 18.

The gate 19 is provided in a gate hole 20. The gate hole 20 is provided on a prominent section 21 within the case 11, the prominent section 21 projecting toward the case 12. Also, the prominent section 21 is provided with a recess 22 disposed adjacent to the gate hole 20. A projection 23 that is provided within the case 12 and projects toward the case 11 is fitted into the recess 22. In other words, the recess 22 and the projection 23 are fitted into each other for positioning of the cases 11 and 12 to be assembled with each other. Incidentally, the projection 23 projects from a prominent section 25 provided in the case 12.

Figure 4:
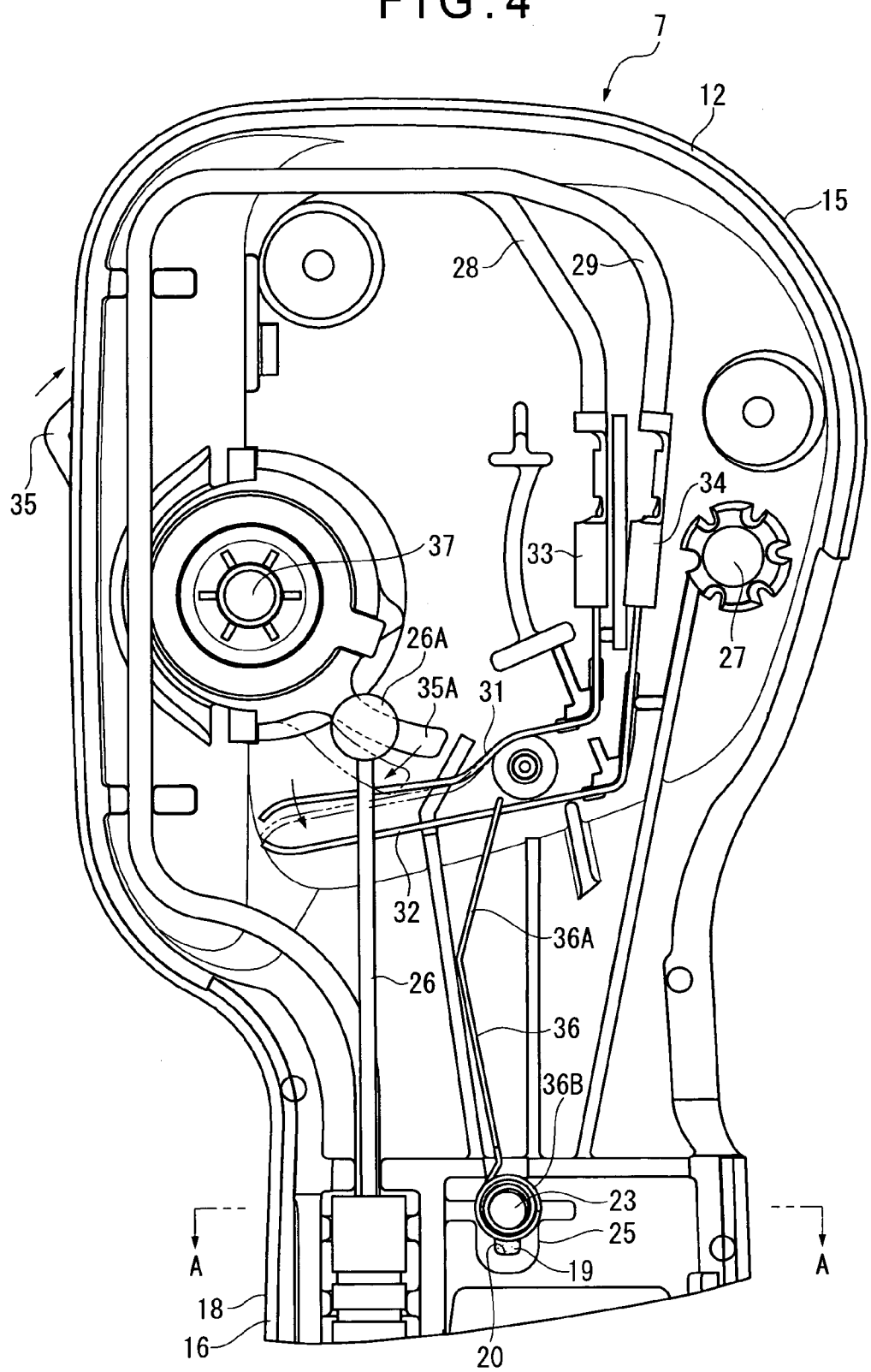
FIG. 4 is a plan view showing an inner arrangement of one of cases forming the handle.

As shown in FIG. 4, a gate hole 20 is disposed adjacent to the projection 23 of the prominent section 25 in the case 12. A gate 19 is formed in the gate hole 20 by injection-molding of the resin layer 18 in the case 12. Though both of the gates 19 are typically longer as compared to the lengths thereof shown in the figure due to a molding die structure thereof, an unnecessary part of each of the gates 19 is cut at a position adjacent to an end surface of the prominent section 21 or 25.

As shown in FIGS. 3 and 4, a Bowden wire 26 is provided in the case 12 of the handle 7. A cylinder 26A, which is provided on one end of the Bowden wire 26, is engaged with the accelerator lever 14 (FIG. 2) rotatably pivoted by a shaft 27. The other end of the Bowden wire 26 is connected to a throttle mechanism of a carburetor (not shown) to control a throttle opening degree of the carburetor, i.e., an engine output, by operating the accelerator lever 14.

Further, a pair of cables 28 and 29 are provided in the handle 7. The cable 28 is connected to a power-generating coil attached to the engine. The cable 29 is a conductive line of the invention and is connected to a crankcase that is used for grounding in the engine. Ends of the cables 28 and 29 are attached to solderless terminals 33 and 34, respectively. The solderless terminals 33 and 34 respectively include curving terminals 31 and 32 having predetermined lengths.

The solderless terminals 33 and 34 are spaced away from each other to be insulated from each other. By operating a stop lever 35 rotatably pivoted by a shaft 37, a press section 35A of the stop lever 35 presses the terminal 31 to bring the terminal 31 in contact with the terminal 32, so that electrical short-circuit can be made (see the arrows and the chained lines in FIG. 4). Since electromotive force from the coil is grounded to the crankcase under such state, the electromotive force is not supplied to an engine plug. Thus, the driving engine can be urgently stopped.

Figure 5:
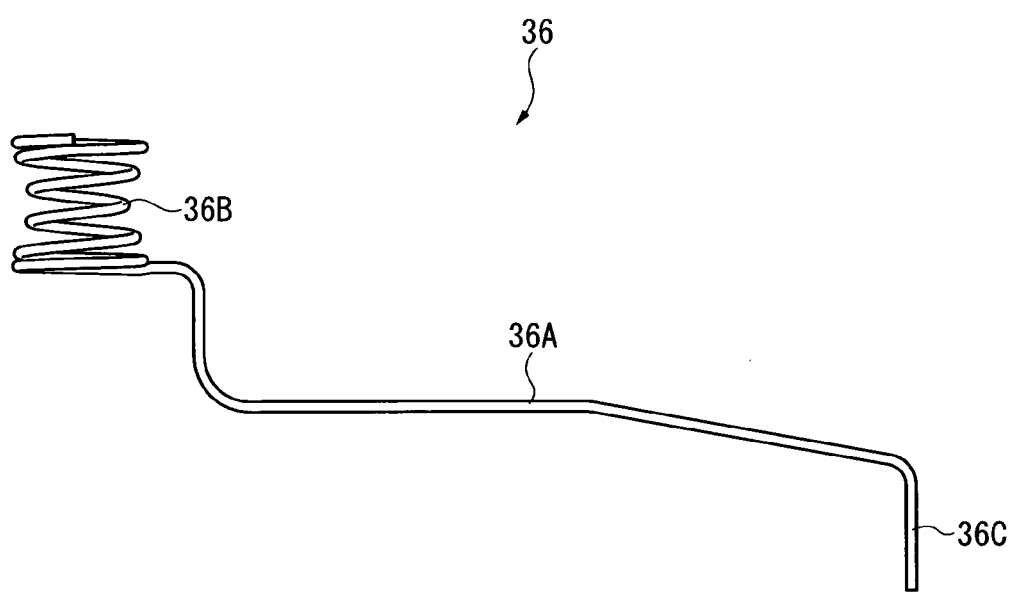
FIG. 5 shows a spring provided within the handle.

In this exemplary embodiment, a linearly extended section 36A of a conductive spring 36 is always in contact with the terminal 32 of the cable 29 provided for grounding. As shown in FIG. 5, a base end of the extended section 36A of the spring 36 provides a coil 36B that works as a compression spring. The coil 36B is wound to exhibit a hand-drum shape that has a large diameter on both sides and has a small diameter in the middle thereof in an extendable direction. Also, a distal end of the extended section 36A provides an engagement 36C that bends from the extended section 36A to be engaged with the terminal 32.

As shown in FIGS. 3 through 5, in the spring 36, the coil 36B that is tensible from an end surface of the prominent section 25 of the case 12 is penetrated by the protrusion 23. Then, the case 11 is assembled with the case 12, so that the coil 36B is compressed to be interposed between the end surfaces of the prominent sections 21 and 25 opposed to each other as shown in FIG. 3. In other words, the coil 36B is compressed in a direction at which the cases 11 and 12 are assembled with each other.

Under such a state that the coil 36B is interposed therebetween, one end of the coil 36B on a side adjacent to the case 11 is in contact with the gate 19 exposed from the prominent section 21, and the other end of the coil 36B on a side adjacent to the case 12 is in contact with the gate 19 exposed from the prominent section 25 (FIG. 4). In other words, the conductive resin layer 18 formed in the handle 7 is in conduction with the spring 36 via the gate 19, and therefore is in conduction with the crankcase of the engine via the cable 29 having the terminal 32 for grounding.

At this time, since the coil 36B is extensible in the direction in which the cases 11 and 12 are assembled with each other, i.e., a longitudinal direction of the gate 19, even when projecting amounts of the gates 19 from the prominent sections 21 and 25 vary, the variations can be adjusted by the extension and retraction of the coil 36B so that the gate 19 can be reliably in contact with the spring 36. Further, since the coil 36B has a predetermined tensional force, the gates 19 and the coil 36B are brought into contact with each other while being pressed. Thus, the gates 19 and the coil 36B are highly reliably in contact with each other.

Furthermore, since the coil 36B is penetrated by the projection 23, even when the projection 23 and the coil 36B does not completely fit, the coil 36B can be elastically deformed in a slanting direction so that the coil 36B can be reliably brought into contact with the gates 19. Since the gates 19 are respectively disposed adjacent to the recess 22 and the projection 23 and, in addition, the coil 36B is penetrated by the projection 23 used for positioning the cases 11 and 12, the gates 19 and the coil 36B are not excessively misaligned. In this respect, the coil 36B can be also reliably brought into contact with the gates 19.

Since the spring 36 is provided with the engagement 36C engaged with the terminal 32, the spring 36 can be prevented from being largely rotated about the projection 23, and the extended section 36A and the engagement 36C can be prevented from being slipped from the terminal 32. Thus, the coil 36B can be favorably in contact with the gate 19 on the side adjacent to the terminal 32.

In such a structure as described above, static electricity generated in the volute 2, the elbow 5 and the ventilation tube 6 are initially led to the engine integrated with the volute 2, and then led to the resin layer 18 of the handle 7 via the cable 29 and the spring 36. Subsequently, the static electricity is discharged through an operator gripping the handle 7. Consequently, the static electricity is removed as soon as being generated, and therefore is not built up in the engine blower 1. Thus, even when the operator touches the ventilation tube 6 or the like during operation, the large amount of static electricity is not suddenly flowed through the operator's body, thereby eliminating uncomfortable feeling to the operator.

In this exemplary embodiment, static electricity led from the engine is discharged through the operator's body. However, depending on a built-up state of the static electricity generated in the ventilation tube 6 or the handle 7, static electricity may be gathered in the resin layer 18 of the grip 16 to discharge through the operator's body for removal of the electricity. Alternatively, the static electricity may be grounded to the crankcase of the engine from the resin layer 18 via the spring 36 and the cable 29.

The best arrangements, methods, and the like for carrying out the invention have been heretofore disclosed, but the scope of the invention is not limited thereto. Although the invention is illustrated and described mainly with reference to a specified embodiment, those skilled in the art may variously modify the embodiment in shapes, amounts, and other detail arrangements without departing from the spirit and an object of the invention.

Thus, a shape, quantity and the like described above merely serve as exemplifying the invention for facilitating an understanding of the invention, and do not serve as any limitations on the invention, so that what is described by a name of a component for which the description of the shape, quantity and the like are partially or totally omitted is also included in the invention.

For example, though the conductive line of the invention is provided by the cable 29 for grounding and the extended section 36A of the spring 36 is in contact with the cable 29 in the exemplary embodiment, the Bowden wire 26 connected to the carburetor may serve as the conductive line and the extended section 36A may be in contact with the Bowden wire 26. In such arrangement, since the carburetor is electrically coupled with the engine, static electricity can be eliminated similarly to the above exemplary embodiment.

Though the gates 19 are used as interior exposed sections of the invention in the exemplary embodiment, a dedicated interior exposed sections may be provided on the inner sides of the cases 11 and 12 to be brought into contact with the spring 36 when the gates are provided on a surface of the resin layer 18, for example.

The invention claimed is:

1. An engine blower, comprising:
   a fan accommodated in a volute;
   an engine integrated with the volute for driving the fan;
   a ventilation tube communicated with the volute; and
   a handle mounted to the ventilation tube, wherein
   the handle has at least a pair of cases that are assembled with each other,
   a conductive resin layer is formed on a surface of a grip of the handle,
   the resin layer is integrated with interior exposed sections exposed within the handle,
   a conductive spring having a coil compressed in a direction in which the cases are assembled with each other and a conductive line electrically coupled with the engine are disposed within the handle, and
   the interior exposed sections of the resin layer are brought into contact with the coil of the spring while being electrically coupled with the conductive line via the spring.

2. The engine blower according to claim 1, wherein
   a projection and a recess that are fitted into each other for positioning are provided on the pair of cases,
   the spring is disposed with the coil penetrated by the projection, and
   the interior exposed sections are provided adjacent to the recess and the projection, respectively.

3. The engine blower according to claim 2, wherein
   the spring is provided with an engagement engaged on a side adjacent to the conductive line.

4. The engine blower according to claim 1, wherein
   the interior exposed sections are provided by gates that are formed when the resin layer is formed by resin molding.

* * * * *